(12) United States Patent
Rhodes et al.

(10) Patent No.: US 7,087,944 B2
(45) Date of Patent: Aug. 8, 2006

(54) IMAGE SENSOR HAVING A CHARGE STORAGE REGION PROVIDED WITHIN AN IMPLANT REGION

(75) Inventors: Howard Rhodes, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/345,155

(22) Filed: Jan. 16, 2003

(65) Prior Publication Data
US 2004/0140491 A1 Jul. 22, 2004

(51) Int. Cl.
*H01L 27/146* (2006.01)
(52) U.S. Cl. .................... 257/292; 257/291
(58) Field of Classification Search ............. 257/291, 257/292
See application file for complete search history.

(56) References Cited

U.S. PATENT DOCUMENTS

| 5,625,210 | A  | * | 4/1997  | Lee et al. ................ 257/292 |
| 5,977,576 | A  | * | 11/1999 | Hamasaki ................ 257/292 |
| 6,026,964 | A  | * | 2/2000  | Hook et al. .............. 257/292 |
| 6,072,206 | A  | * | 6/2000  | Yamashita et al. ........ 257/292 |
| 6,271,553 | B1 | * | 8/2001  | Pan ....................... 257/292 |
| 6,310,366 | B1 | * | 10/2001 | Rhodes et al. ............ 257/431 |
| 6,392,263 | B1 | * | 5/2002  | Chen et al. .............. 257/292 |
| 6,423,993 | B1 | * | 7/2002  | Suzuki et al. ............ 257/292 |
| 6,462,365 | B1 | * | 10/2002 | He et al. ................. 257/292 |
| 6,504,196 | B1 | * | 1/2003  | Rhodes .................... 257/292 |

* cited by examiner

*Primary Examiner*—Gene M. Munson
(74) *Attorney, Agent, or Firm*—Dickstein Shapiro Morin & Oshinsky LLP (57) ABSTRACT

A deep implanted region of a first conductivity type located below a transistor array of a pixel sensor cell and adjacent a doped region of a second conductivity type of a photodiode of the pixel sensor cell is disclosed. The deep implanted region reduces surface leakage and dark current and increases the capacitance of the photodiode by acting as a reflective barrier to photo-generated charge in the doped region of the second conductivity type of the photodiode. The deep implanted region also provides improved charge transfer from the charge collection region of the photodiode to a floating diffusion region adjacent the gate of the transfer transistor.

64 Claims, 4 Drawing Sheets

IMAGE SENSOR HAVING A CHARGE STORAGE REGION PROVIDED WITHIN AN IMPLANT REGION

FIELD OF THE INVENTION

The present invention relates to the field of semiconductor devices and, in particular, to high quantum efficiency CMOS image sensors.

BACKGROUND OF THE INVENTION

CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode for transferring electrons to a sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transfer.

In a conventional CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. The charge at the floating diffusion node is converted to a pixel output voltage by the source follower output transistor. The photosensitive element of a CMOS imager pixel is typically either a depleted p-n junction photodiode or a field induced depletion region beneath a photogate.

CMOS imaging devices of the type discussed above are generally known and discussed in, for example, Nixon et al., "256.times.256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994), the disclosures of which are incorporated by reference herein.

Figure 1:
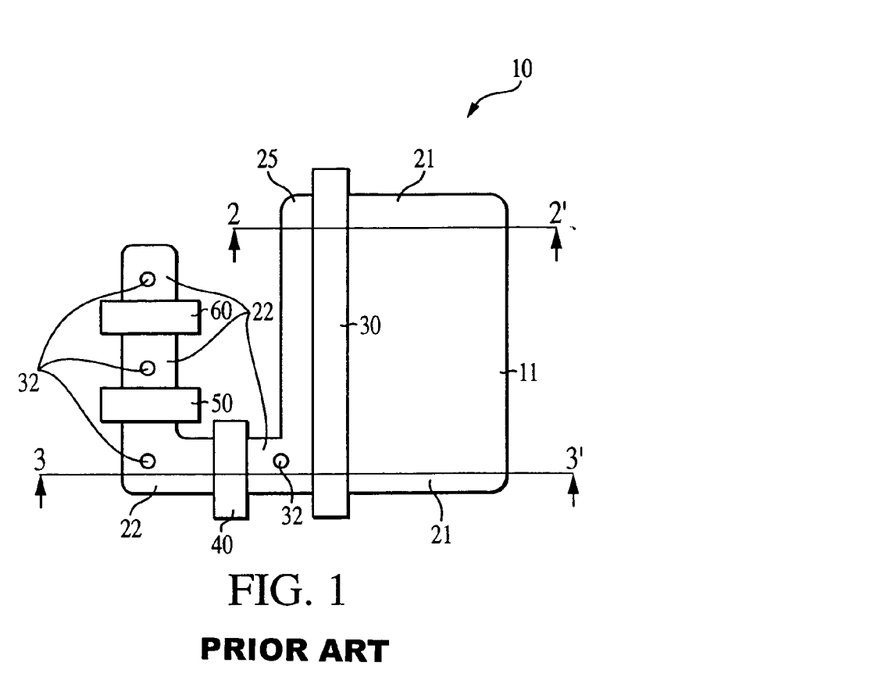
FIG. 1 is a top plan view of an exemplary CMOS image sensor pixel.
Figure 2:
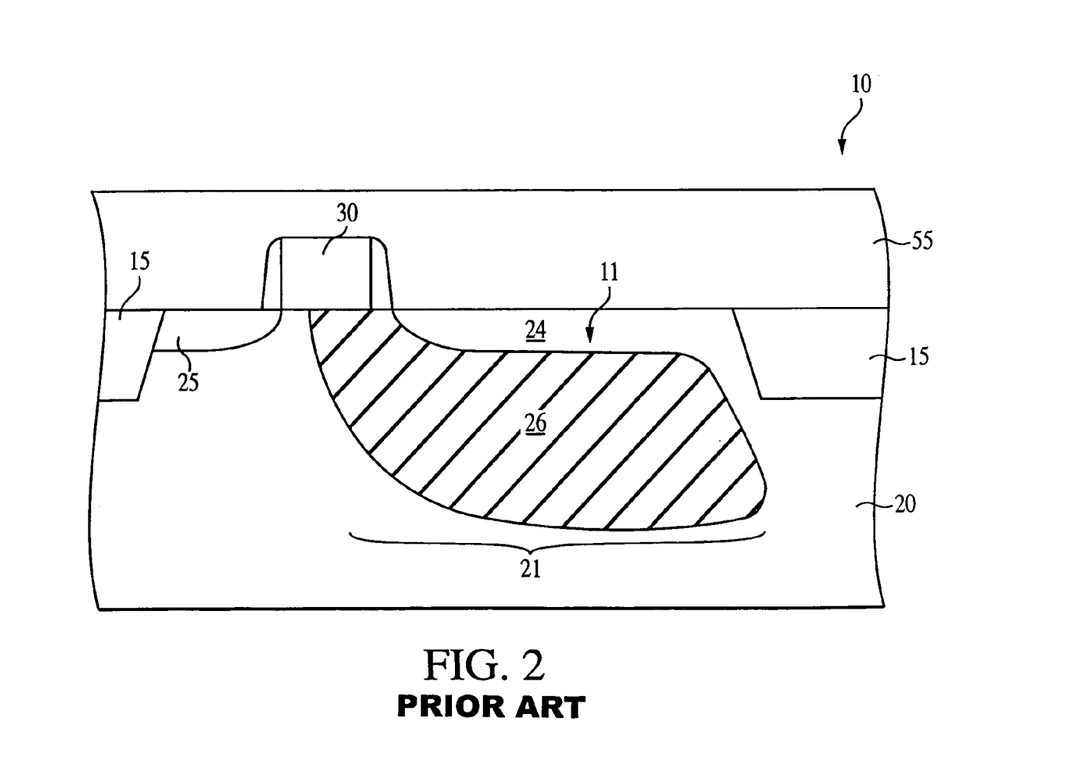
FIG. 2 is a schematic cross-sectional view of the CMOS image sensor of FIG. 1 taken along line 2–2'.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned diode 11 (FIG. 2). The pinned photodiode is termed "pinned" because the potential in the photodiode is pinned to a constant value when the photodiode is fully depleted. It should be understood, however, that the CMOS sensor pixel cell 10 may include a photogate, a photoconductor or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

A cross-sectional view of the exemplary CMOS image sensor 10 of FIG. 1 taken along line 2–2' is illustrated in FIG. 2. The charge accumulating region 21 is formed as a pinned photodiode 11 which has a photosensitive or p-n-p junction region formed by a p-type layer 24, an n-type region 26 and the p-type substrate 20. The pinned photodiode 11 includes two p-type regions 20, 24 so that the n-type photodiode region 26 is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferable n-type.

FIG. 2 also illustrates trench isolation regions 15 formed in the active layer 20 adjacent the charge accumulating region 21. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Generally, in CMOS image sensors such as the CMOS image sensor cell 10 of FIGS. 1–2, incident light causes electrons to collect in region 26. A maximum output signal, which is produced by the source follower transistor having gate 50, is proportional to the number of electrons to be extracted from the region 26. The maximum output signal increases with increased electron capacitance or acceptability of the region 26 to acquire electrons. The electron capacity of pinned photodiodes typically depends on the doping level of the image sensor and the dopants implanted into the active layer.

Minimizing dark current in the photodiode is important in CMOS image sensor fabrication. Dark current is generally attributed to leakage in the charge collection region 21 of the pinned photodiode 11, which is strongly dependent on the doping implantation conditions of the CMOS image sensor. In addition, defects and trap sites inside or near the photodiode depletion region strongly influence the magnitude of dark current generated. In sum, dark current is a result of current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

CMOS imagers also typically suffer from poor signal to noise ratios and poor dynamic range as a result of the inability to fully collect and store the electric charge collected in the region 26. Since the size of the pixel electrical signal is very small due to the collection of photons in the photo array, the signal to noise ratio and dynamic range of the pixel should be as high as possible.

There is needed, therefore, an improved active pixel photosensor for use in a CMOS imager that exhibits reduced dark current and increased photodiode capacitance, while also having low pixel-to-pixel cross-talk. A method of fabricating an active pixel photosensor exhibiting these improvements is also needed.

BRIEF SUMMARY OF THE INVENTION

In one aspect, the invention provides a deep implanted region of a first conductivity type located below a transistor array of a pixel sensor cell and laterally adjacent a doped region of a second conductivity type of a photodiode of the pixel sensor cell. The deep implanted region reduces surface leakage and dark current and increases the capacitance of the photodiode by acting as a reflective barrier to electrons generated by light in the doped region of the second conductivity type of the photodiode. The deep implanted region also provides optimal transfer of charges from the charge collection region to a floating diffusion region adjacent the gate of the transfer transistor.

In another aspect, the invention provides a method of forming a deep implanted region below a transistor array of a pixel sensor cell and laterally adjacent a charge collection region of a photodiode of the pixel sensor cell. The deep implanted region is formed by conducting at least one deep implant for implanting desired dopants below the transistor array and subsequent to the patterning of the transistor gate structures of the pixel sensor cell.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Referring now to the drawings, where like elements are designated by like reference numerals, FIGS. 3–6 illustrate exemplary embodiments of methods of forming a four-transistor (4T) pixel sensor cell 100 (FIG. 6) having a deep implanted region or well 199 formed below a transistor array 101 and adjacent a charge collection region 126 of photodiode 188. As explained in detail below, the deep implanted region 199 is formed by implanting dopants of a first conductivity type below the transistor array 101 and in the bulk substrate 110. The deep implanted region 199 is adjacent a doped region 126 of a second conductivity type forming the charge collection region of the photodiode 188 and acts as a reflective barrier to electrons generated by light in the doped region 126 of the second conductivity type.

It should be noted that, although the invention will be described below in connection with use in a four-transistor (4T) pixel cell, the invention also has applicability to a three-transistor (3T) cell which differs from the 4T cell in the omission of a charge transfer transistor described below, as known in the art. In this case, the deep implant is still located adjacent the charge collection region of a photodiode.

Figure 3:
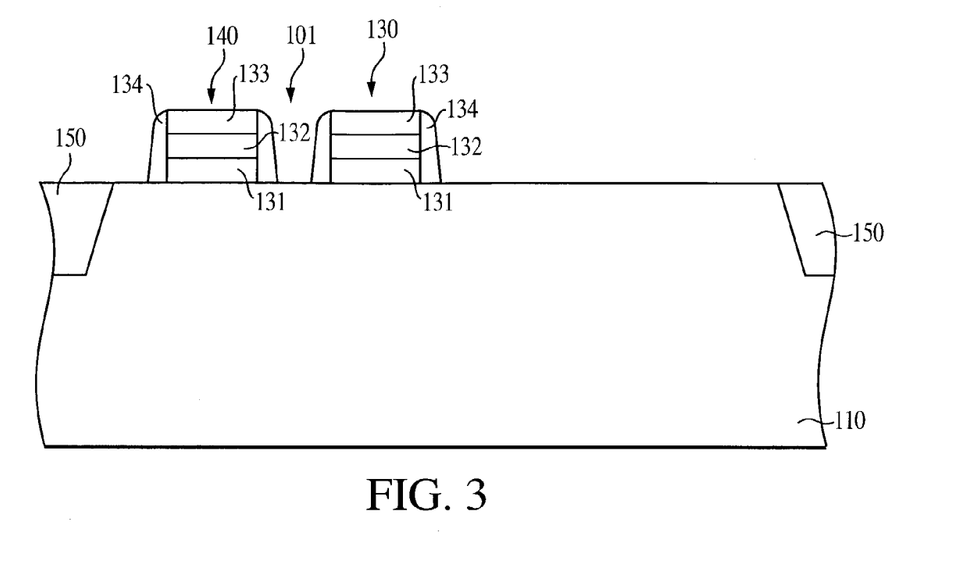
FIG. 3 is a schematic cross-sectional view of a CMOS image sensor pixel fabricated in accordance with the present invention and at an initial stage of processing.

FIG. 3 illustrates a substrate 110 along a cross-sectional view of the structure of FIG. 1 taken along line 3–3'. For exemplary purposes, the substrate 110 is a silicon substrate. However, as noted above, the invention has equal application to other semiconductor substrates. FIG. 3 also illustrates a multi-layered transfer and reset gate stacks 130 and 140, respectively, formed over the silicon substrate 110 and as part of transistor array 101. The transfer and reset gate stacks 130 comprise a first gate oxide layer 131 of grown or deposited silicon oxide on the silicon substrate 110, a conductive layer 132 of doped polysilicon or other suitable conductor material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

If desired, a silicide layer (not shown) may be also formed in the multi-layered gate stacks 130, 140 between the conductive layer 132 and the second insulating layer 133. Advantageously, the gate structures of all other transistors in the imager circuit design may have this additionally formed silicide layer. This silicide layer may be titanium silicide, tungsten silicide, cobalt suicide, molybdenum silicide, or tantalum silicide. The silicide layer could also be a barrier layer/refractory metal such as TiN/W or $WN_x$/W or it could be entirely formed of $WN_x$. FIG. 3 also illustrates insulating sidewall spacers 134 formed on the sides of the transfer gate 130 and of the reset gate 140. The sidewall spacers 134 may be formed, for example, of silicon dioxide, silicon nitride, silicon oxynitride, ON, NO, ONO or TEOS, among others.

FIG. 3 also illustrates isolation regions 150 which are formed within the substrate 110 and are filled with a dielectric material, which may be an oxide material, for example a silicon oxide such as SiO or $SiO_2$, oxynitride, a nitride material such as silicon nitride, silicon carbide, or other suitable dielectric materials. In a preferred embodiment, however, the isolation regions 150 are shallow trench isolation regions and the dielectric material is a high density plasma (HDP) oxide, a material which has a high ability to effectively fill narrow trenches. Thus, for simplicity, reference to the isolation regions 150 will be made in this application as to the shallow trench isolation regions 150. The shallow trench isolation regions 150 have a depth of about 1,000 to about 4,000 Angstroms, more preferably of about 2,000 Angstroms.

Although FIGS. 3–6 illustrate only a portion of the substrate 110 with only two shallow trench isolation regions 150, it must be understood that the present invention contemplates the simultaneous formation of more than two shallow trench isolation structures at various locations on the substrate 110 to isolate the pixels one from another and to isolate other structures as well.

In addition, if desired, a thin insulating layer (not shown) may be formed on the sidewalls and bottom of the shallow trench before the filling of the trench with the dielectric material which, as noted above, is preferably a high density plasma (HDP) oxide. The thin insulating layer may be formed of an oxide or of silicon nitride, for example, to aid in smoothing out the corners in the bottom of the trench and to reduce the amount of stress in the dielectric material used to later fill in the trenches.

Figure 4:
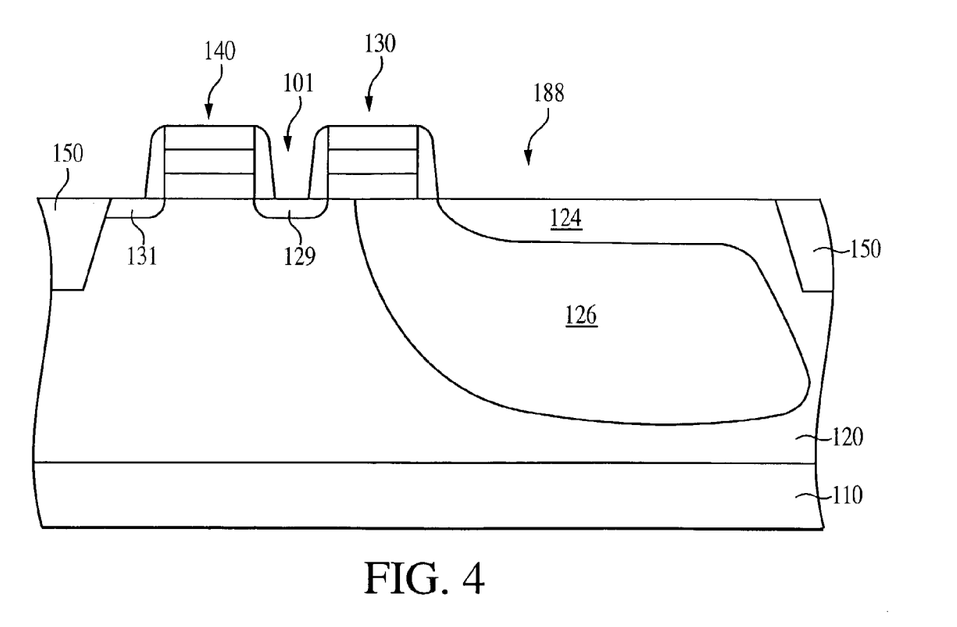
FIG. 4 is a schematic cross-sectional view of a CMOS image sensor fragment of FIG. 3 at a stage of processing subsequent to that shown in FIG. 3.

Referring now to FIG. 4, a p-n-p photodiode 188 is formed by regions 124, 126 and 120 within the substrate 110. The p-type doped layer 120 is formed in the areas of the substrate 110 directly beneath the active area of the pixel cell by conducting a dopant implantation with a dopant of a first conductivity type, which for exemplary purposes is p-type. The p-type doped layer 120 may be formed subsequent to the formation of the shallow trench isolation (STI) 150 and of the gate stacks 130, 140. However, it must be understood that the p-type doped layer 120 may be also formed prior to the formation of the shallow trench isolation (STI) 150 and/or gate stacks 130, 140. The dopant concentration in the p-type doped layer 120 is within the range of about $1 \times 10^{15}$ to about $5 \times 10^{18}$ atoms per $cm^3$, and is preferably within the range of about $1 \times 10^{16}$ to about $5 \times 10^{17}$ atoms per $cm^3$.

The n-type region 126 (FIG. 4) is formed by implanting dopants of a second conductivity type, which for exemplary purposes is n-type, in the area of the substrate directly beneath the active area of the pixel cell. The implanted n-doped region 126 forms a photosensitive charge storage region for collecting photogenerated electrons. Ion implantation may be conducted by placing the substrate 110 in an ion implanter, and implanting appropriate n-type dopant ions into the substrate 110 at an energy of 20 keV to 300 keV to form n-doped region 126. N-type dopants such as arsenic, antimony, or phosphorous may be employed. The dopant concentration in the n-doped region 126 (FIG. 4) is within the range of about $5 \times 10^{15}$ to about $5 \times 10^{16}$ atoms per $cm^3$, and is preferably within the range of about $1 \times 10^{16}$ to about $5 \times 10^{16}$ atoms per $cm^3$.

The p-type pinned surface layer 124 is also formed by conducting a dopant implantation with a dopant of the first conductivity type, which for exemplary purposes is p-type, so that p-type ions are implanted into the area of the substrate over the implanted n-type region 126 and between the transfer gate 130 and shallow trench isolation region 150. The dopant concentration in the p-type pinned surface layer 124 is within the range of about $1 \times 10^{17}$ to about $5 \times 10^{18}$ atoms per $cm^3$, and is preferably within the range of about $1 \times 10^{18}$ atoms per $cm^3$.

Subsequent to the formation of the p-n-p photodiode 188 and of the transfer and reset gates 130, 140, a photoresist layer 167 (FIG. 5) is formed over the p-n-p photodiode 188 and the transfer and reset gates 130, 140, to a thickness of about 1,000 Angstroms to about 10,000 Angstroms. The photoresist layer 167 (FIG. 5) is patterned with a mask (not shown) to obtain an opening 168 (FIG. 5) which, on one side, partially extends over transfer gate 130 by an offset distance W, as illustrated in FIG. 5 and, on the other side, is approximately coincident with the edge of the STI region 150 (the left most STI region in FIG. 5).

The offset distance W (FIG. 5) may be tailored according to the photodiode and transfer gate characteristics to achieve an optimal dopant gradient from the n-type charge collection region 126 of the photodiode 188 to n-type floating diffusion region 129. The offset distance W may be about 10% to about 90% the length L (FIG. 5) of the transfer gate 130, more preferably of about 25% to about 75% the length L of the transfer gate 130. For example, a transfer gate having a length L of about 0.5 microns may require an offset distance W of about 50% the length of the transfer gate, that is, of about 0.25 microns. Similarly, a transfer gate having a length L of about 0.3 microns may require an offset distance W of about 25% the length of the transfer gate, that is, of about 0.13 microns.

Figure 5:
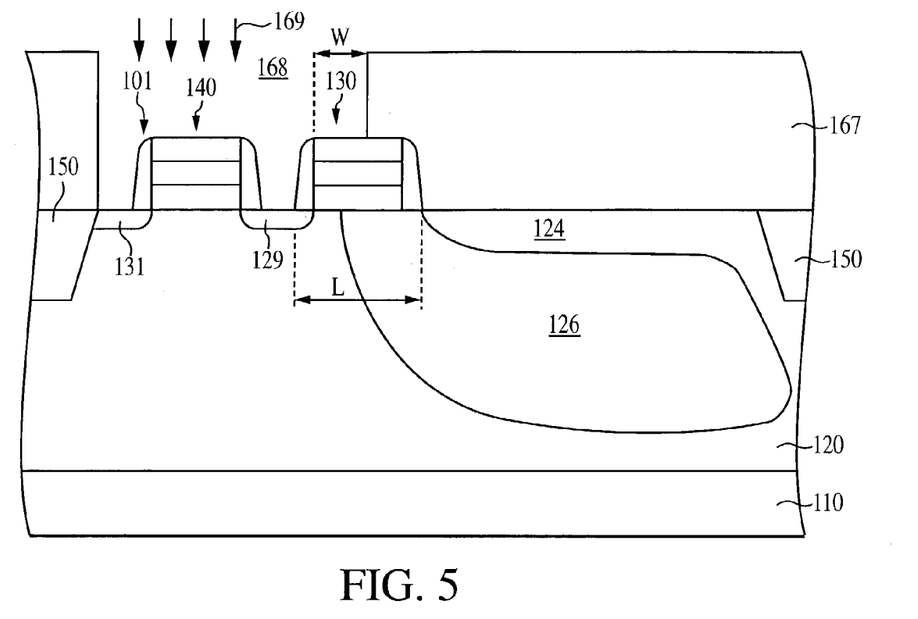
FIG. 5 is a schematic cross-sectional view of a CMOS image sensor pixel of FIG. 3 at a stage of processing subsequent to that shown in FIG. 4.
Figure 6:
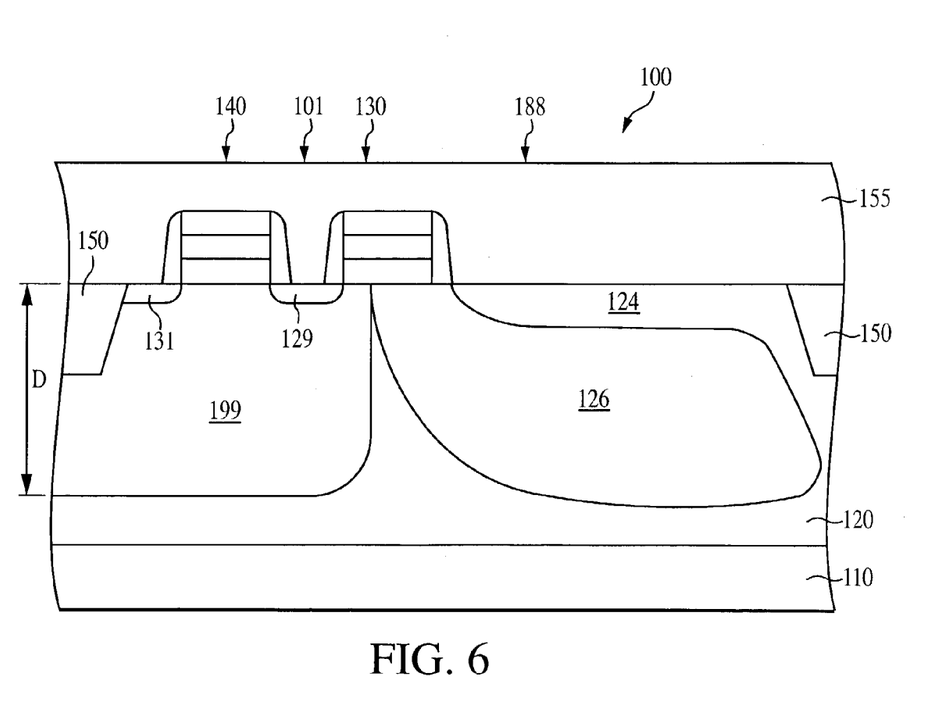
FIG. 6 is a schematic cross-sectional view of a CMOS image sensor pixel of FIG. 3 at a stage of processing subsequent to that shown in FIG. 5.

Next, the structure of FIG. 5 is subjected to a deep masked dopant implantation 169 (FIG. 5) with a dopant of the first conductivity type, which for exemplary purposes is p-type. This way, p-type ions are implanted through the opening 168 (FIG. 5) to form a p-type deep implanted region 199 located below the transistor array 101 and in contact with the n-type doped region 126, as illustrated in FIG. 6. Although, the p-type deep implanted region 199 may be formed in contact with the n-type doped region 126, as shown in FIG. 6, the invention is not limited to this embodiment. Accordingly, the present invention also contemplates the formation of a p-type deep implanted region adjacent and spaced from the n-type doped region 126, in accordance with the photodiode and transfer gate characteristics.

The deep dopant implantation 169 is conducted to implant p-type ions, such as boron, beryllium, indium or magnesium, into an area of the substrate 110 located right below the transistor array 101. The dopant implantation 169 may be conducted by placing the substrate 110 in an ion implanter and implanting appropriate p-type dopant ions through the opening 168 (FIG. 5) into the substrate 110 at an energy of 50 keV to about 150 keV, more preferably of about 90 keV, to form the deep p-type implanted region or well 199. P-type dopants, such as boron, beryllium, indium or magnesium, may be employed for the first implant. The dopant concentration in the deep p-type implanted region 199 (FIG. 6) is within the range of about $1 \times 10^{15}$ to about $1 \times 10^{17}$ atoms per $cm_3$, more preferably of about $5 \times 10^{15}$ to about $5 \times 10^{16}$ atoms per $cm^3$.

The photoresist layer 167 is then removed by conventional techniques, such as oxygen plasma for example, or by flooding the substrate 110 with UV radiation, to complete the formation of deep implanted region 199 (FIG. 6) and the formation of the pixel sensor cell 100 (FIG. 6).

The deep implanted region 199 of FIG. 6 acts as a reflective barrier to electrons generated by light in the n-doped region 126 of the p-n-p photodiode 188. When light radiation in the form of photons strikes the n-doped photosite region 126, photo-energy is converted to electron-hole pairs. For the case of an n-doped photosite in a p-n-p photodiode, it is the electrons that are accumulated in the n-doped region 126. For the case of a p-doped photosite in an n-p-n photodiode, it is the holes that are accumulated in the n-doped region 126. Thus, in the exemplary embodiment described above having n-channel devices formed in the p-type well 120, electrons are accumulated in the n-doped region 126. The deep implanted region 199 located below the transistor array 101 acts to reduce carrier loss to the substrate 110 by forming a concentration gradient that modifies the band diagram and serves to reflect electrons back towards the n-doped photosite region 126, thereby reducing cross-talk between adjacent pixel sensor cells.

In addition to providing a reflective barrier to electrons generated by light in the charge collection region 126, the deep implanted region 199 creates a dopant gradient from the photodiode 188 to the floating diffusion region 129 (FIG. 6). As known in the art, one figure of merit (FoM) of the transfer gate 130 is the efficiency of the gate 130 to transfer accumulated charge from the n-doped region 126 of the photodiode 188 to the floating diffusion region 129. One way of increasing the transfer efficiency of the gate 130 is to physically apply a potential gradient Vt from the n-doped region 126 of the photodiode 188 to the floating diffusion region 129. The present invention provides another way of increasing the transfer efficiency of the gate 130, that is, by creating a dopant gradient conferred by the deep implanted region 199 (FIG. 6) that optimizes the transfer of charge from the n-doped region 126 to the floating diffusion region 129.

The deep implanted region 199 also provides photodiode-to-photodiode isolation, for example, isolation of the photodiode 188 from an adjacent photodiode (not shown) located on the other side of the shallow trench isolation region 150.

Although FIGS. 3–6 illustrate deep implanted region 199 formed by conducting only one implant, the invention is not limited to this embodiment and contemplates the formation of a deep implanted region formed by conducting a plurality "i" of such deep implants. Preferably, the number "i" of implants and the dopant concentration of each implant may be tailored so that depth D (FIG. 6) of the deep implanted region 199 is equal to or greater than the depth of the n-type doped region 126 of the photodiode 188. This way, one skilled in the art may tailor the dosage and implant energy of each of the "i" implants to form the deep implanted region 199 which acts as a barrier to fully reflect electrons back toward the n-doped photosite region 126 and provide complete isolation of the photodiode 188 from adjacent photodiodes. Preferably, the depth D of the p-type implanted region 199 of the substrate 110 may be of about 0.5 microns to about 7.0 microns, more preferably of about 1.0 microns to about 5.0 microns.

The remaining devices of the pixel sensor cell 100, including the source follower transistor and row select transistor shown in FIG. 1 as associated with respective gates 50 and 60 and source/drain regions on either sides of the gates 40, 50, 60, are also formed by well-known methods. Conventional processing steps may be also employed to form contacts and wiring to connect transistor gate and source and drain regions of pixel cell 100. For example, the entire surface may be covered with a passivation layer 155 (FIG. 6) of, e.g., silicon dioxide, BSG, PSG, or BPSG, which is CMP planarized and etched to provide contact holes, which are then metallized to provide contacts to the reset gate, transfer gate and other pixel structures, as needed. Conventional multiple layers of conductors and insulators to other circuit structures may also be used to interconnect the internal structures of the pixel sensor cell and to connect the pixel cell structures to other circuitry associated with the pixel array.

Figure 7:
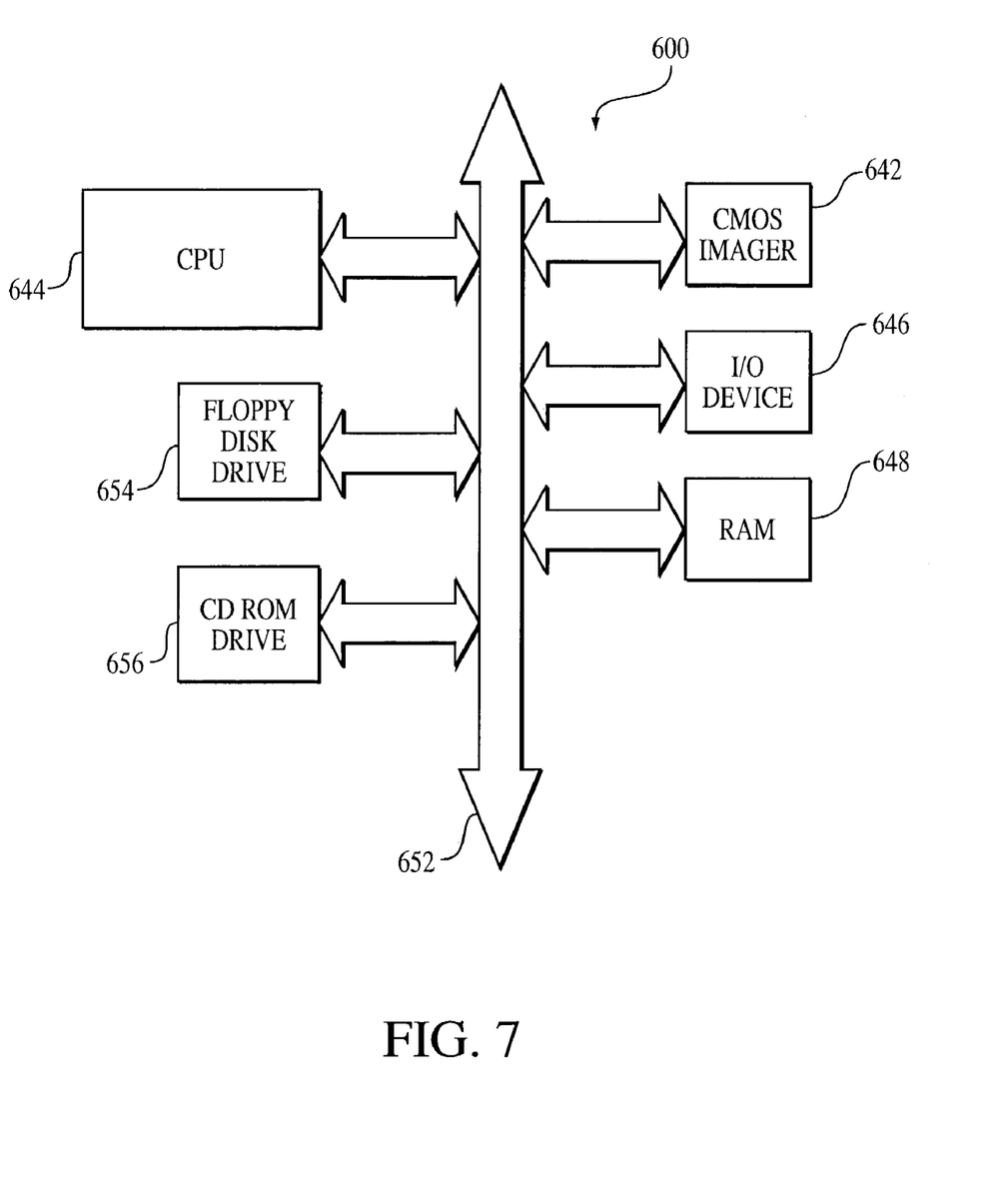
FIG. 7 illustrates a schematic diagram of a computer processor system incorporating a CMOS image sensor fabricated according to the present invention.

A typical processor based system 600, which has a connected CMOS imager having pixels constructed according to the invention is illustrated in FIG. 7. A processor based system is exemplary of a system having digital circuits which could include CMOS imagers. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS imager 642 communicates with the system over bus 652. The computer system 600 also includes random access memory (RAM) 648, and may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the above embodiments have been described with reference to the formation of a p-n-p photodiode, such as the p-n-p photodiode 188 (FIGS. 3–6) having an n-type charge collection region formed adjacent a deep implanted region 199 formed by implantation below a transistor array, it must be understood that the invention is not limited to this embodiment. Accordingly, the invention has equal applicability to n-p-n photodiodes comprising an p-type charge collection region formed adjacent a p-type deep implanted region formed below a transistor array. Of course, the dopant and conductivity type of all structures will change accordingly, with the transfer gate corresponding to a PMOS transistor. The invention has further applicability to p-n or n-p photodiodes, that is, photodiodes that do not include a "pinned" or "surface" layer. The above described embodiments are not limited to the photodiode described herein. For example, the photosensor embodiments may be implemented as either a photogate or photoconductor.

In addition, although the invention has been described above with reference to a transfer gate of a transfer transistor connection for use in a four-transistor (4T) pixel cell, the invention also has applicability to a three-transistor (3T) cell which differs from the 4T cell in the omission of a charge transfer gate 130, the formation of which was described above. In this case, the deep implanted region 199 is still formed to be laterally adjacent a charge collection region 126.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. An image sensor comprising:
   a substrate having a first dopant concentration;
   a photosensor for collecting charges in a charge collection region of a first conductivity type located within a doped layer of a second conductivity type of said substrate, said charge collection region extending vertically within said substrate to a first depth, a gate structure of a transistor formed over said substrate for gating charges collected by said charge collection region;
   an implanted region of said second conductivity type, having a second dopant concentration, within said substrate, wherein said implanted region is located laterally of said photosensor and adjacent said charge collection region, and wherein said implanted region extends vertically within said substrate to a second depth which is greater than said first depth; and
   a charge storage region of said first conductivity type formed in said implanted region for receiving charges gated by said gate structure,
   wherein said first dopant concentration and said second dopant concentration are unequal.

2. The image sensor of claim 1, wherein said photosensor is a photodiode.

3. The image sensor of claim 2, wherein said photodiode is an n-p photodiode.

4. The image sensor of claim 2, wherein said photodiode is a p-n photodiode.

5. The image sensor of claim 2, wherein said photodiode is a p-n-p photodiode.

6. The image sensor of claim 2, wherein said photodiode is an n-p-n photodiode.

7. The image sensor of claim 1, wherein at least a portion of the bottom of said gate structure is in contact with said implanted region.

8. The image sensor of claim 7, wherein said gate structure comprises a transfer transistor gate for transferring charge accumulated in said charge collection region to a said charge storage region.

9. The image sensor of claim 1, wherein said implanted region has a depth of about 0.5 microns to about 7.0 microns.

10. The image sensor of claim 9, wherein said implanted region has a depth of about 1.0 microns to about 5.0 microns.

11. The image sensor of claim 1, wherein said implanted region is doped with a p-type dopant and the second dopant concentration of the implanted region is from about $1 \times 10^{15}$ to about $1 \times 10^{17}$ atoms per cm$^3$.

12. The image sensor of claim 11, wherein said implanted region is doped with a p-type dopant and the second dopant concentration of the implanted region is from about $5 \times 10^{15}$ to about $5 \times 10^{17}$ atoms per cm$^3$.

13. The image sensor of claim 1, wherein said first conductivity type is p-type and said second conductivity type is n-type.

14. The image sensor of claim 1, wherein said first conductivity type is n-type and said second conductivity type is p-type.

15. A pixel for use in an imaging device, said pixel comprising:
   a substrate;
   a first doped layer, having a first dopant concentration, of a second conductivity type formed in said substrate;
   an implanted region, having a second dopant concentration, of said second conductivity type formed in said doped layer;
   a charge collection region formed in said first doped layer for accumulating photo-generated charge, said charge collection region being of a first conductivity type and being laterally adjacent to said implanted region of said second conductivity type;
   a channel region of a transfer transistor, said transfer transistor transferring charge accumulated in said charge collection region to a charge storage region of said first conductivity type formed in said implanted region; and
   a second doped layer of said second conductivity type formed in said first doped layer and above said charge collection region,
   wherein said first dopant concentration and said second dopant concentration are unequal.

16. The pixel of claim 15, wherein said charge collection region is part of a photodiode.

17. The pixel of claim 16, wherein said photodiode is an n-p photodiode.

18. The pixel of claim 16, wherein said photodiode is a p-n photodiode.

19. The pixel of claim 16, wherein said photodiode is a p-n-p photodiode.

20. The pixel of claim 16, wherein said photodiode is an n-p-n photodiode.

21. The pixel of claim 15, wherein said implanted region is in contact with said charge collection region.

22. The pixel of claim 15 further comprising a gate of a transistor formed over said substrate, at least a portion of the bottom of said gate being over said implanted region.

23. The pixel of claim 15, further comprising a transfer gate of a transfer transistor adjacent said charge collection region, said transfer gate transferring charge accumulated in said charge collection region to said charge storage region.

24. The pixel of claim 15, wherein said implanted region is doped with a p-type dopant and the second dopant concentration of the implanted region is from about $1 \times 10^{15}$ to about $1 \times 10^{17}$ atoms per cm$^3$.

25. The pixel of claim 24, wherein said implanted region is doped with a p-type dopant and the second dopant concentration of the implanted region is from about $5 \times 10^{15}$ to about $5 \times 10^{16}$ atoms per cm$^3$.

26. The pixel of claim 15, wherein said implanted region has a depth of about 0.5 microns to about 7.0 microns.

27. The pixel of claim 26, wherein said implanted region has a depth of about 1.0 microns to about 5.0 microns.

28. The pixel of claim 15, wherein said first conductivity type is p-type and said second conductivity type is n-type.

29. The pixel of claim 15, wherein said first conductivity type is n-type and said second conductivity type is p-type.

30. An image sensor comprising:
   a silicon p-type substrate having a first dopant concentration;
   a shallow trench isolation region formed within said silicon substrate;
   a pixel within an area at least partially defined by said shallow trench isolation region, said pixel comprising:
      a photosensor, said photosensor further comprising a p-type layer and an n-type doped region located adjacent and below said p-type layer;

a transfer transistor having a channel region for transferring charge accumulated in said n-type doped region to an n-type charge storage region;

a p-type implanted region, having second dopant concentration, provided within said silicon substrate, said charge storage region being formed in said p-type implanted region; and wherein said first dopant concentration and said second dopant concentration are unequal.

31. The image sensor of claim 30, wherein said photosensor is part of a four transistor pixel cell.

32. The image sensor of claim 30, wherein said p-type implanted region is located along at least a portion of the bottom of said channel region.

33. The image sensor of claim 30, wherein said charge storage region is a floating diffusion region.

34. The image sensor of claim 30, wherein said p-type implanted region has a depth of about 0.5 microns to about 7.0 microns.

35. The image sensor of claim 34, wherein said p-type implanted region has a depth of about 1.0 microns to about 5.0 microns.

36. The image sensor of claim 30, wherein said second dopant concentration of said p-type implanted region has a dopant concentration from about $1 \times 10^{15}$ to about $1 \times 10^{17}$ atoms per $cm^3$.

37. The image sensor of claim 36, wherein said second dopant concentration of said p-type implanted region has a dopant concentration from about $5 \times 10^{15}$ to about $5 \times 10^{16}$ atoms per $cm^3$.

38. An image sensor comprising:
a silicon substrate having a first dopant concentration;
a shallow trench isolation region formed within said silicon substrate;
a pixel within an area at least partially defined by said shallow trench isolation region, said pixel comprising:
a p-n-p photodiode;
a channel region of a transistor adjacent said photodiode;
an implanted region, having a second dopant concentration, within said silicon substrate and adjacent said p-n-p photodiode and said channel region; and
a charge storing floating diffusion region formed in said implanted region,
wherein said first dopant concentration and said second dopant concentration are unequal.

39. The image sensor of claim 38, wherein said p-n-p photodiode further comprises a p-type pinned layer and an n-type doped layer located adjacent and below said p-type pinned layer, and said substrate being p-type.

40. The image sensor of claim 39, wherein said transistor is a transfer transistor, said transfer transistor transferring charge accumulated in said n-type doped layer to said floating diffusion region.

41. The image sensor of claim 40, wherein said floating diffusion region is a n-type doped region.

42. The image sensor of claim 38, wherein said implanted region is a p-type implanted region located along at least a portion of the bottom of said channel region.

43. The image sensor of claim 42, wherein said p-type implanted region has a depth of about 0.5 microns to about 7.0 microns.

44. The image sensor of claim 43, wherein said p-type implanted region has a depth of about 1.0 microns to about 5.0 microns.

45. The image sensor of claim 38, wherein said second dopant concentration of said implanted region has a dopant concentration of about $1 \times 10^{15}$ to about $1 \times 10^{17}$ atoms per $cm^3$.

46. The image sensor of claim 45, wherein said second dopant concentration of said implanted region has a dopant concentration of about $5 \times 10^{15}$ to about $5 \times 10^{16}$ atoms per $cm^3$.

47. An image sensor comprising:
a silicon substrate having a first dopant concentration;
a shallow trench isolation region formed within said silicon substrate;
a pixel within an area at least partially defined by said shallow trench isolation region, said pixel comprising:
a p-n-p photodiode, said p-n-p photodiode further comprising a p-type pinned layer and an n-type doped layer located adjacent and below said p-type pinned layer;
a channel region of a transfer transistor, said transfer transistor transferring charge accumulated in said n-type doped layer to an n-type charge storage region; and
a p-type implanted region, having a second dopant concentration, within said silicon substrate and adjacent said n-type doped layer, said charge storage region being formed in said p-type implanted region,
wherein said first dopant concentration and said second dopant concentration are unequal.

48. The image sensor of claim 47, wherein said p-type implanted region is located along at least a portion of the bottom of said channel region.

49. The image sensor of claim 47, wherein said n-type doped region is a floating diffusion region.

50. The image sensor of claim 47, wherein said p-type implanted region has a depth of about 0.5 microns to about 7.0 microns.

51. The image sensor of claim 50, wherein said p-type implanted region has a depth of about 1.0 microns to about 5.0 microns.

52. The image sensor of claim 47, wherein said second dopant concentration of said p-type implanted region has a dopant concentration of about $1 \times 10^{15}$ to about $1 \times 10^{17}$ atoms per $cm^3$.

53. The image sensor of claim 52, wherein said second dopant concentration of said p-type implanted region has a dopant concentration of about $5 \times 10^{15}$ to about $5 \times 10^{16}$ atoms per $cm^3$.

54. An imager system comprising:
a processor; and
an imaging device coupled to said processor, said imaging device comprising:
an isolation region formed in a substrate;
a pixel adjacent said isolation region, said pixel comprising:
a first layer of a second conductivity type, having a first dopant concentration, formed in said substrate;
a photosensor adjacent a gate structure of a transistor, said photosensor further comprising a second layer of said second conductivity type, and a doped region of the first conductivity type located below said second layer;
an implanted region of said second conductivity type, having a second dopant concentration, within said substrate, said implanted region being located laterally and adjacent said photosensor, and in contact with said doped region; and
a floating diffusion region formed in said implanted region, wherein said first dopant concentration and said second dopant concentration are unequal.

55. The system of claim 54, wherein said implanted region has a depth of about 0.5 microns to about 7.0 microns.

56. The system of claim 55, wherein said implanted region has a depth of about 1.0 microns to about 5.0 microns.

57. The system of claim 54, wherein said first conductivity type is p-type and said second conductivity type is n-type.

58. The system of claim 54, wherein said first conductivity type is n-type and said second conductivity type is p-type.

59. The system of claim 54, wherein said photosensor is a photodiode.

60. The system of claim 59, wherein said photodiode is an n-p photodiode.

61. The system of claim 59, wherein said photodiode is a p-n photodiode.

62. The system of claim 59, wherein said photodiode is an n-p-n photodiode.

63. The system of claim 59, wherein said photodiode is a p-n-p photodiode.

64. An image sensor comprising:

a substrate having a first dopant concentration;

a photosensor having a charge collection region of a first conductivity type located within a doped layer of a second conductivity type of said substrate;

a transfer gate for gating charges from said charge collection region;

an implanted region of said second conductivity type, having a second dopant concentration, formed within said substrate, and partially under said transfer gate, wherein said implanted region is located laterally of said photosensor and adjacent said charge collection region; and a floating diffusion region formed in said implanted region and being separated from said charge collection region by a portion of said implanted region, wherein said first dopant concentration and said second dopant concentration are unequal.

* * * * *